(12) United States Patent
Luo

(10) Patent No.: US 12,356,655 B2
(45) Date of Patent: Jul. 8, 2025

(54) METHOD FOR FORMING SEMICONDUCTOR STRUCTURE, AND SEMICONDUCTOR STRUCTURE

(71) Applicant: CHANGXIN MEMORY TECHNOLOGIES, INC., Hefei (CN)

(72) Inventor: Qing Luo, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 366 days.

(21) Appl. No.: 17/808,526

(22) Filed: Jun. 23, 2022

(65) Prior Publication Data
US 2023/0119755 A1   Apr. 20, 2023

Related U.S. Application Data

(63) Continuation of application No. PCT/CN2021/131918, filed on Nov. 19, 2021.

(30) Foreign Application Priority Data

Oct. 15, 2021  (CN) .......................... 202111202134.8

(51) Int. Cl.
| | | |
|---|---|---|
| *H10D 30/00* | (2025.01) | |
| *H01L 21/265* | (2006.01) | |
| *H10D 30/01* | (2025.01) | |
| *H10D 30/60* | (2025.01) | |
| *H10D 62/17* | (2025.01) | |

(52) U.S. Cl.
CPC ..... *H10D 30/601* (2025.01); *H01L 21/26586* (2013.01); *H10D 30/022* (2025.01); *H10D 62/299* (2025.01)

(58) Field of Classification Search
None
See application file for complete search history.

(56) References Cited

U.S. PATENT DOCUMENTS

| | | | | |
|---|---|---|---|---|
| 8,273,629 B2* | 9/2012 | Wang | ..................... | H10D 86/01 |
| | | | | 438/257 |
| 2011/0039390 A1* | 2/2011 | Nieh | ..................... | H10D 30/601 |
| | | | | 438/305 |

(Continued)

FOREIGN PATENT DOCUMENTS

| | | |
|---|---|---|
| CN | 1393915 A | 1/2003 |
| CN | 1405864 A | 3/2003 |

(Continued)

*Primary Examiner* — Bilkis Jahan
(74) *Attorney, Agent, or Firm* — Syncoda LLC; Feng Ma

(57) ABSTRACT

A method for forming a semiconductor structure includes: providing a substrate, in which a gate structure is formed on the substrate; forming first side walls covering side surfaces of the gate structure, in which the first side walls have a first preset thickness in a direction parallel to a plane of the substrate; performing first ion implantation on the substrate on both sides of the gate structure exposed to the first side walls; removing a part of the first side walls to form second side walls, in which the second side walls have a second preset thickness in the direction parallel to the plane of the substrate; and performing second ion implantation on the substrate on both sides of the gate structure, in which doping types of the first ion implantation and the second ion implantation are different.

12 Claims, 18 Drawing Sheets

(56) References Cited

U.S. PATENT DOCUMENTS

| | | | |
|---|---|---|---|
| 2011/0316079 A1* | 12/2011 | Nieh | H10D 30/022 |
| | | | 257/344 |
| 2012/0135575 A1* | 5/2012 | Wong | H10D 62/371 |
| | | | 257/E21.409 |
| 2013/0113041 A1* | 5/2013 | Liu | H10D 30/022 |
| | | | 438/289 |
| 2015/0200272 A1* | 7/2015 | Liu | H10D 30/0278 |
| | | | 438/289 |
| 2015/0200296 A1* | 7/2015 | Yu | H01L 21/30604 |
| | | | 438/301 |
| 2015/0243759 A1* | 8/2015 | Huang | H01L 21/26586 |
| | | | 438/302 |
| 2015/0249141 A1* | 9/2015 | Yu | H10D 62/314 |
| | | | 257/77 |
| 2022/0246762 A1* | 8/2022 | Li | H01L 29/6653 |

FOREIGN PATENT DOCUMENTS

| | | |
|---|---|---|
| CN | 109037069 A | 12/2018 |
| CN | 109309009 A | 2/2019 |
| JP | H10294453 A | 11/1998 |
| JP | 2007288051 A | 11/2007 |

* cited by examiner

METHOD FOR FORMING SEMICONDUCTOR STRUCTURE, AND SEMICONDUCTOR STRUCTURE

CROSS-REFERENCE TO RELATED APPLICATIONS

The disclosure is a continuation application of International Application No. PCT/CN2021/131918 filed on Nov. 19, 2021, which claims priority to Chinese Patent Application No. 202111202134.8 filed on Oct. 15, 2021. The disclosures of these applications are hereby incorporated by reference in their entirety.

BACKGROUND

As MOSFET devices continue to shrink in size, in particular to a node of 65 nm or less, the MOSFET devices have various adverse physical effects due to extremely short channels, such as short channel effect (SCE) or gate induced drain leakage (GIDL), which severely restrict improvement of device performance. The SCE affects the device channel length, threshold voltage and the like that can be used, so that device performance and reliability are degraded, and further reduction of feature size is limited.

SUMMARY

The disclosure relates to the field of semiconductor device fabrication, and in particular, to method for forming a semiconductor structure, and a semiconductor structure.

In this regard, embodiments of the disclosure provide a method for forming a semiconductor structure and a semiconductor structure.

According to a first aspect of the embodiments of the disclosure, provided is a method for forming a semiconductor structure.

The method includes: providing a substrate, in which a gate structure is formed on the substrate; forming firstly side walls covering side surfaces of the gate structure, in which the first side walls have a first preset thickness in a direction parallel to a plane of the substrate; performing first ion implantation on the substrate on both sides of the gate structure exposed to the first side walls; removing a part of the first side walls to form a second side walls, in which the second side walls have a second preset thickness in the direction parallel to the plane of the substrate; and performing second ion implantation on the substrate on both sides of the gate structure, where a doping type of the first ion implantation and a doping type of the second ion implantation are different.

According to a second aspect of the embodiments of the disclosure, provided is a method for forming a semiconductor structure. The method includes: providing a substrate, in which a gate structure is provided on the substrate; forming third side walls covering side surfaces of the gate structure, in which the third side walls have a third preset thickness in a direction parallel to a plane of the substrate; forming fourth side walls covering side surfaces of the third side walls, in which the fourth side walls have a fourth preset thickness in the direction parallel to the plane of the substrate, and there is a high etch selectivity ratio between the third side walls and the fourth side walls; performing first ion implantation on the substrate on both sides of the gate structure exposed to the third side walls and the fourth side walls; removing the fourth side walls; and performing second ion implantation on the substrate on both sides of the gate structure, in which a doping type of the first ion implantation and a doping type of the second ion implantation are different.

According to a third aspect of the embodiments of the disclosure, provided is a semiconductor structure, the semiconductor structure includes: a substrate; a gate structure located on the substrate, where side walls are formed on a side surfaces of the gate structure; and LDD areas and Halo areas, located in the substrate, in which in a direction perpendicular to a plane of the substrate, projections of the LDD areas and a projection of the gate structure do not overlap, and projections of the Halo areas and the projection of the gate structure have overlapping portions.

DETAILED DESCRIPTION

Figure 1:
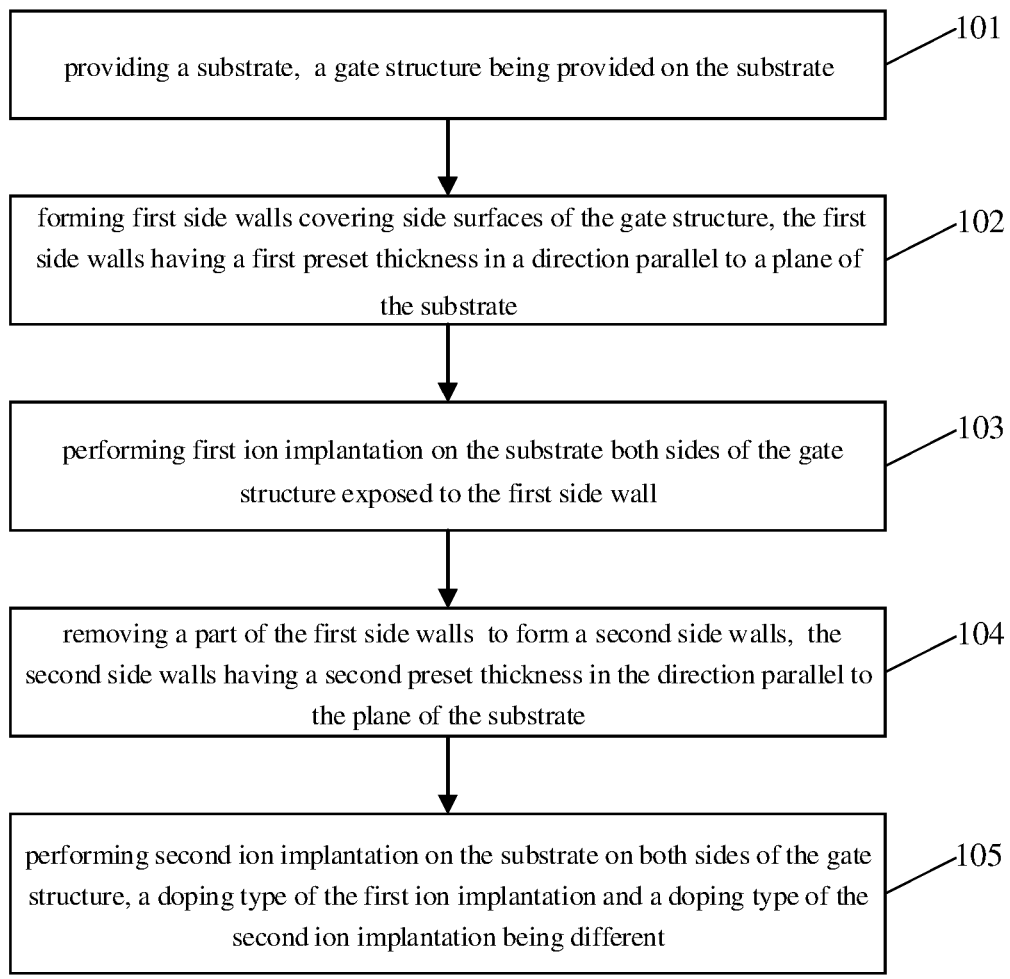
FIG. 1 is a schematic flowchart of a method for forming a semiconductor structure according to an embodiment of the disclosure.

Exemplary implementations of the disclosure will be described in more detail below with reference to the accompanying drawings. Although the accompanying drawings illustrate the exemplary implementations of the disclosure, it should be understood that the disclosure can be implemented in multiple forms, and should not be limited by the particular implementations described here. On the contrary, the purpose of providing these implementations is to more thoroughly understand the disclosure, and the scope of the disclosure may be fully conveyed to persons skilled in the art.

In the following description, numerous specific details are given in order to provide a more thorough understanding of the disclosure. However, it is apparent to persons skilled in the art that the disclosure may be implemented without one or more of these details. In other examples, in order to avoid confusion with the disclosure, some technical features well known in the art are not described. That is, all the features of the actual embodiments are not described herein, and well-known functions and structures are not described in detail.

In the accompanying drawings, for clarity, the sizes of layers, areas, elements and their relative sizes may be exaggerated. The same reference numerals denote the same components throughout the disclosure.

It should be understood that when an element or layer is referred to as "on", "adjacent to", "connected to" or "coupled to" another element or layer, it can be directly on the other element or layer, adjacent, connected or coupled to the other element or layer, or, an intervening element or layer may be present. In contrast, when an element is referred to as being "directly on", "directly adjacent to", "directly connected to" or "directly coupled to" another element or layer, there are no intervening element or layer. It should be understood that though the terms first, second, third, etc., are used to describe the elements, components, areas, layers and/or sections, those elements, components, areas, layers and/or sections should not be limited by these terms. The terms are merely used to distinguish one element, component, area, layer or section from another element, component, area, layer or section. Thus, a first element, component, area, layer or section, which is discussed below, may be referred to as a second element, component, area, layer or section, without departing from the spirit of the disclosure. Moreover, when a second element, component, area, layer or section is discussed, it does not mean that a first element, component, area, layer or section is necessarily present in the disclosure.

Spatially relative terms, such as "under", "below", "lower", "beneath", "above", "upper", etc., may be used herein for ease of description to describe the relationship between one element or feature and another element or feature as illustrated in the drawings. It should be understood that the spatially relative terms are intended to encompass different orientations of a device in use or operation, in addition to the orientation depicted in the drawings. For example, if the device in the drawings is turned over, an element or feature described as "below" or "beneath" or "under" another element would then be oriented as "above" relative to the other element or feature. Therefore, the exemplary terms "below" and "under" can encompass orientations of both above and below. The device may be otherwise oriented (rotated by 90 degrees or at other orientations), and the spatially relative descriptors used herein are interpreted accordingly.

The terms used herein are for the purpose of describing particular embodiments only and is not intended to limit the disclosure. As used herein, the singular forms "a", "an" and "the/said" are intended to include the plural forms as well, unless the context clearly indicates otherwise. It should be further understood that the terms "consisting of" and/or "including", when used in this description, specify the presence of stated features, integers, steps, operations, elements, components and/or groups, but do not preclude the presence or addition of one or more other features, integers, steps, operations, elements, components, and/or groups thereof. As used herein, the term "and/or" includes any and all combinations of the associated listed items.

In order to thoroughly understand the disclosure, detailed steps and detailed structures will be presented in the following description to explain the technical solutions of the disclosure. The preferred embodiments of the disclosure are described in detail below. However, in addition to these detailed descriptions, the disclosure may also have other implementations.

In an MOS device, after a polysilicon gate is formed by etching, side walls are formed on side surfaces of the gate to serve as barrier layers when LDD and Halo ions are implanted. LDD ion implantation is generally zero-degree or small-angle implantation, and Halo ion implantation requires a larger angle to implant ions under an MOS channel.

Implanted LDD and Halo ions are subjected to thermal diffusion, and the LDD ions are diffused to the channel, so that the cover area of the drain and the gate is increased, resulting in generation of GIDL current. The implanted Halo ions affect performance of a short-channel device to a greater extent. By adjusting the implantation angle and dose of the Halo ions, the threshold voltage, the channel current, and the cut-off current of the device may be adjusted, and a change in junction leakage may also be affected. The dose of the Halo ions is associated with the threshold voltage of the MOS device. However, the Halo ion implantation angle is affected by the shadow effect, and in order to reach a predetermined threshold voltage, a larger dose of ions needs to be implanted. An increase in ion dose in turn results in generation of junction leakage.

In this case, embodiments of the disclosure provide a method for forming a semiconductor structure. Referring to FIG. 1 for details. As shown in FIG. 1, the method includes the following operations.

In operation 101, a substrate is provided, in which a gate structure is formed on the substrate.

In operation 102, first side wall covering side surfaces of the gate structure are formed, in which the first side walls have a first preset thickness in a direction parallel to a plane of the substrate.

In operation 103, first ion implantation is performed on the substrate both sides of the gate structure exposed to the first side wall.

In operation 104, a part of the first side walls are removed to form a second side walls, in which the second side walls have a second preset thickness in the direction parallel to the plane of the substrate.

In operation 105, second ion implantation is performed on the substrate on both sides of the gate structure, in which a doping type of the first ion implantation and a doping type of the second ion implantation are different.

The method for forming the semiconductor structure according to the embodiments of the disclosure will be further described in detail below in combination with specific embodiments.

FIGS. 2A to 2G are schematic structural diagrams of a semiconductor structure during formation according to embodiments of the disclosure.

Figure 2A:
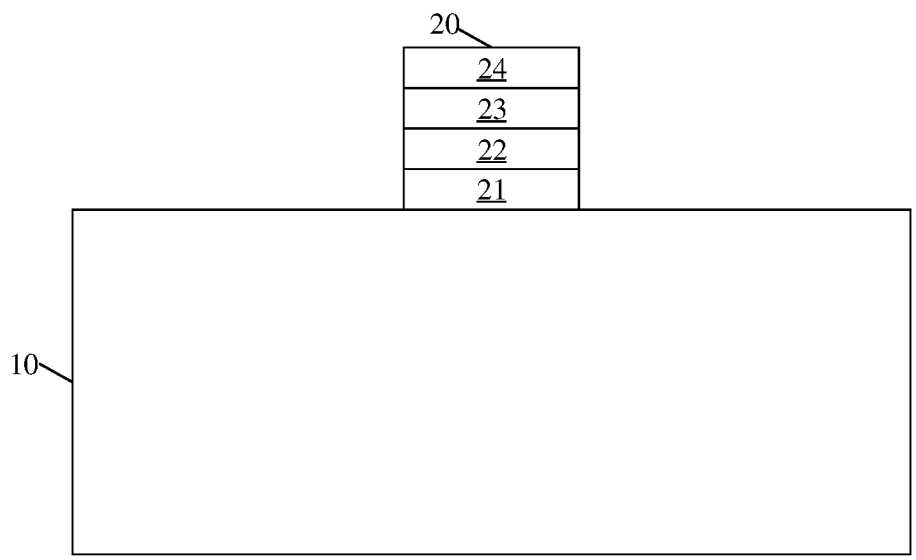
FIG. 2A is a first schematic structural diagram of a semiconductor structure during forming according to embodiments of the disclosure.

First, referring to FIG. 2A, operation 101 is executed: providing a substrate 10, in which a gate structure 20 is formed on the substrate 10.

The substrate 10 may be an elemental semiconductor material substrate (e.g., a silicon (Si) substrate, a germanium (Ge) substrate, etc.), a composite semiconductor material substrate (e.g., a silicon germanium (SiGe) substrate, etc.), a silicon-on-insulator (SOI) substrate, or a germanium-on-insulator (GeOI) substrate, etc.

The gate structure 20 sequentially includes a gate oxide layer 21, a first gate conductive layer 22, a second gate conductive layer 23, and a gate insulating layer 24 from bottom to top.

The material of the gate oxide layer 21 includes, but is not limited to, silicon oxide; the material of the first gate conductive layer 22 includes, but is not limited to, titanium nitride; the material of the second gate conductive layer 23 includes, but is not limited to, tungsten; and the material of the gate insulating layer 24 includes, but is not limited to, silicon nitride.

Figure 2B:
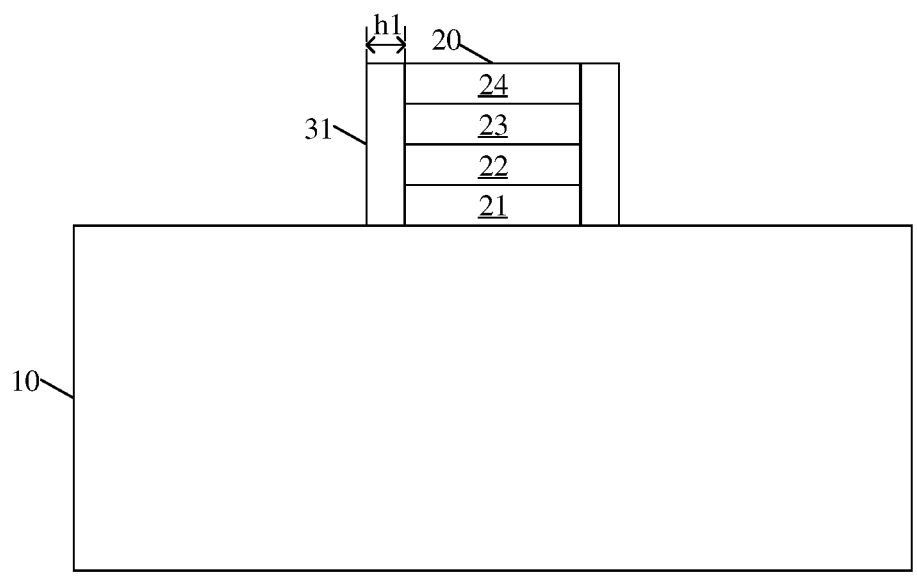
FIG. 2B is a second schematic structural diagram of a semiconductor structure during forming according to embodiments of the disclosure.

Next, referring FIG. 2B, operation 102 is executed: forming first side walls 31 covering side surfaces of the gate structure 20, in which the first side walls 31 have a first preset thickness in a direction parallel to a plane of the substrate 10.

The first side walls 31 may be formed of silicon nitride, silicon oxide, silicon oxynitride, silicon carbide, fluoride-doped silicon glass, a low-k dielectric material, and a combination thereof, and/or other suitable materials.

The first preset thickness is h1 shown in FIG. 2B. In an embodiment, the first preset thickness is 5-10 µm.

Figure 2C:
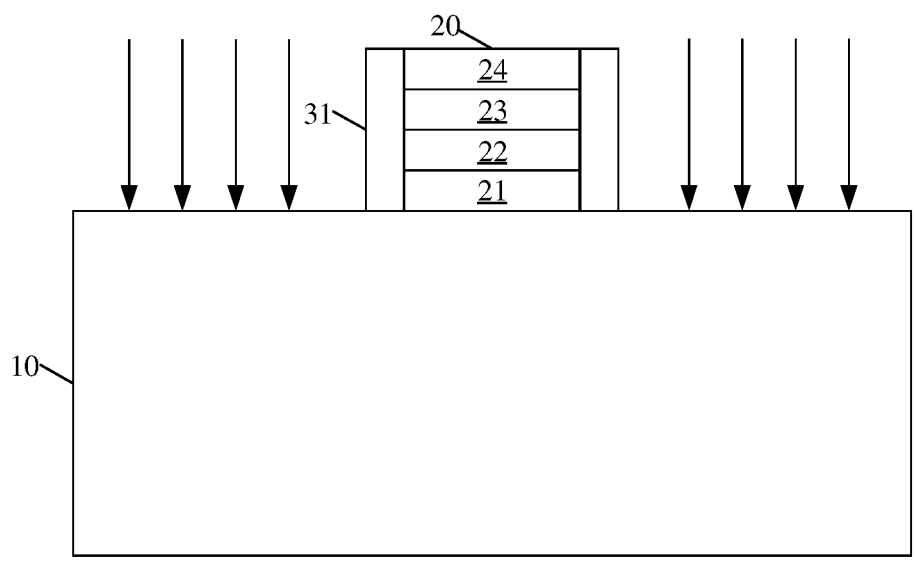
FIG. 2C is a third schematic structural diagram of a semiconductor structure during forming according to embodiments of the disclosure.

Next, referring to FIG. 2C, operation 103 is executed: performing first ion implantation on the substrate 10 on both sides of the gate structure 20 exposed to the first side wall 31.

In an embodiment, the first ion implantation is LDD ion implantation.

After the first ion implantation, LDD ion implantation areas 410 are formed in the substrate 10 on both sides of the gate structure 20.

Figure 2D:
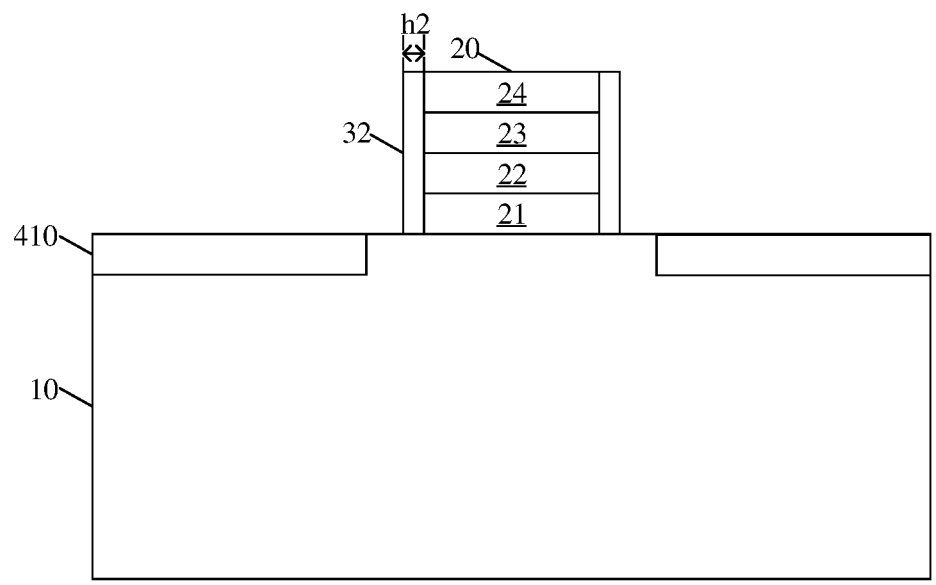
FIG. 2D is a fourth schematic structural diagram of a semiconductor structure during forming according to embodiments of the disclosure.

Next, referring to FIG. 2D, operation 104 is executed: removing a part of the first side walls 31 to form second side walls 32, in which the second side walls 32 have a second preset thickness in the direction parallel to the plane of the substrate 10.

The second preset thickness is h2 shown in FIG. 2D. In an embodiment, the second preset thickness is 1-5 µm.

Figure 2E:
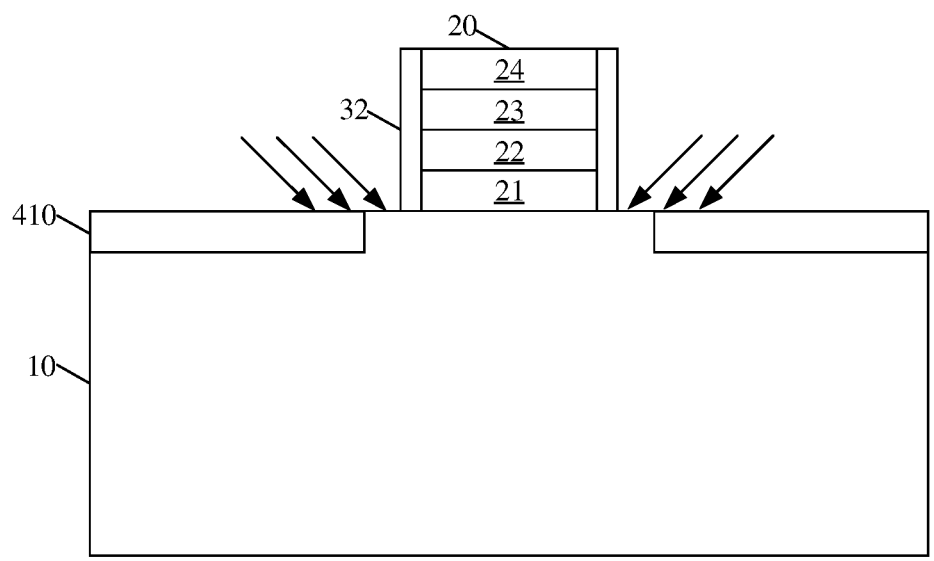
FIG. 2E is a fifth schematic structural diagram of a semiconductor structure during forming according to embodiments of the disclosure.

Next, referring to FIG. 2E, operation 105 is executed: performing second ion implantation on the substrate 10 on both sides of the gate structure 20, in which doping types of the first ion implantation and the second ion implantation are different.

In an embodiment, the second ion implantation is Halo ion implantation.

The doping types of the first ion implantation and the second ion implantation are different, that is, the doping types of the LDD ion implantation and the Halo ion implantation are different. Specifically, by taking an NMOS as an example, if the doping type of the LDD ion implantation is an N type, then the doping type of the Halo ion implantation is a P type.

In an embodiment, the first ion implantation is performed at a first preset included angle which is between a direction of the first ion implantation and a direction perpendicular to the plane of the substrate 10; the second ion implantation is performed at a second preset included angle which is between a direction of the second ion implantation and the direction perpendicular to the plane of the substrate 10; and the first preset included angle is less than the second preset included angle.

For the first ion implantation, that is, LDD ion implantation, vertical implantation or small-angle implantation is generally performed. The first preset included angle is 0°-3°.

For the second ion implantation, that is, Halo ion implantation, large-angle implantation is generally performed. The second preset included angle is 21°-30°.

The vertical implantation or small-angle implantation of LDD ions allows more LDD ions to be dispersed within the substrate on both sides of the gate structure, reducing diffusion of the LDD ions to the substrate under the gate structure, thereby reducing generation of GIDL current. The large-angle implantation of Halo ions may increase the Halo ions entering the substrate under the gate structure, thereby reducing diffusion of the LDD ions, and also reducing the SCE.

In an embodiment, the first ion implantation is performed at a first preset dose, the second ion implantation is performed at a second preset dose; and the first preset dose is greater than the second preset dose.

The first preset dose is $1\times10^{14}$ atoms/cm$^2$, and the second preset dose is $1\times10^{13}$ atoms/cm$^2$.

Figure 2F:
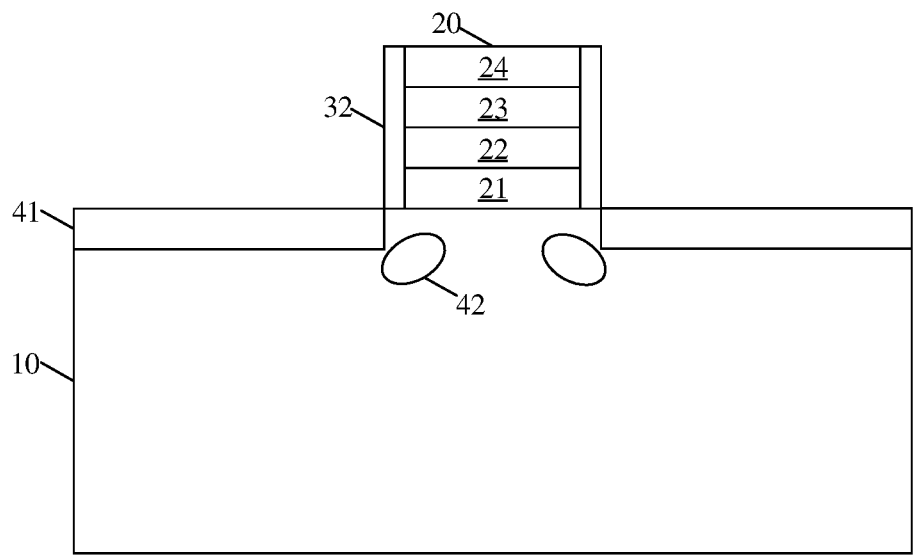
FIG. 2F is a sixth schematic structural diagram of a semiconductor structure during forming according to embodiments of the disclosure.

Next, referring to FIG. 2F, after performing the second ion implantation, thermal diffusion is performed on the substrate 10 on both sides of the gate structure 20 to form LDD areas 41 and Halo areas 42 in the substrate, in which in a direction perpendicular to the plane of the substrate 10, projections of the LDD areas 41 do not overlap a projection of the gate structure 20.

In some embodiments, the cases that the projections of the LDD areas 41 do not overlap the projection of the gate structure 20 includes: side surfaces of the LDD areas 41 are flush with side surfaces of the gate structure 20.

In this embodiment, since the first side walls have a large preset thickness, when the first side walls are taken as a mask to perform LDD ion implantation, diffusion of implanted ions to a channel can be effectively reduced. Therefore, projections of the LDD areas do not overlap the projection of the gate structure.

The LDD ion implantation areas 410 are subjected to thermal diffusion to form the LDD areas 41.

Figure 2G:
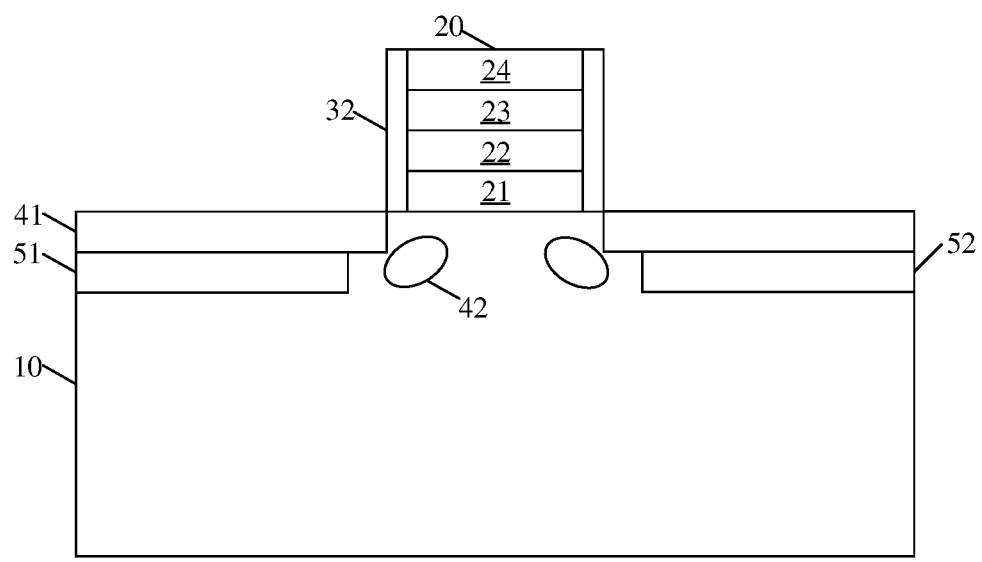
FIG. 2G is a seventh schematic structural diagram of a semiconductor structure during forming according to embodiments of the disclosure.

Next, referring to FIG. 2G, after forming the LDD areas 41 and the Halo areas 42, the method further includes: by taking the second side walls 32 as a mask, performing source-drain ion implantation on the substrate 10 on both sides of the gate structure 20 to form a source area 51 and a drain area 52.

The doping type of the source-drain ion implantation is the same as the doping type of the LDD ion implantation, and is different from the doping type of the Halo ion implantation. Specifically, if the doping type of the LDD ion implantation is a P type, then the doping type of the Halo ion implantation is an N type, and the doping type of the source-drain ion implantation is a P type.

In the embodiments of the disclosure, the first side walls with a larger thickness is firstly formed, and the first side walls is taken as the mask to perform first ion implantation, that is, LDD ion implantation, which can effectively reduce diffusion of implanted ions to the channel, thereby reducing generation of GIDL current. Then, a part of the first side walls are etched away to form the second side walls with a smaller thickness, and second ion implantation, that is, Halo ion implantation, is performed, so that Halo ions implanted under the channel increase, and the SCE can be reduced.

Moreover, in the embodiments of the disclosure, when the Halo ion implantation is performed, the second side walls as the mask has a smaller thickness, and the Halo ions implanted under the channel increase, so that the dose of ions reaching the same threshold voltage correspondingly decreases, thereby reducing generation of junction leakage.

Figure 3:
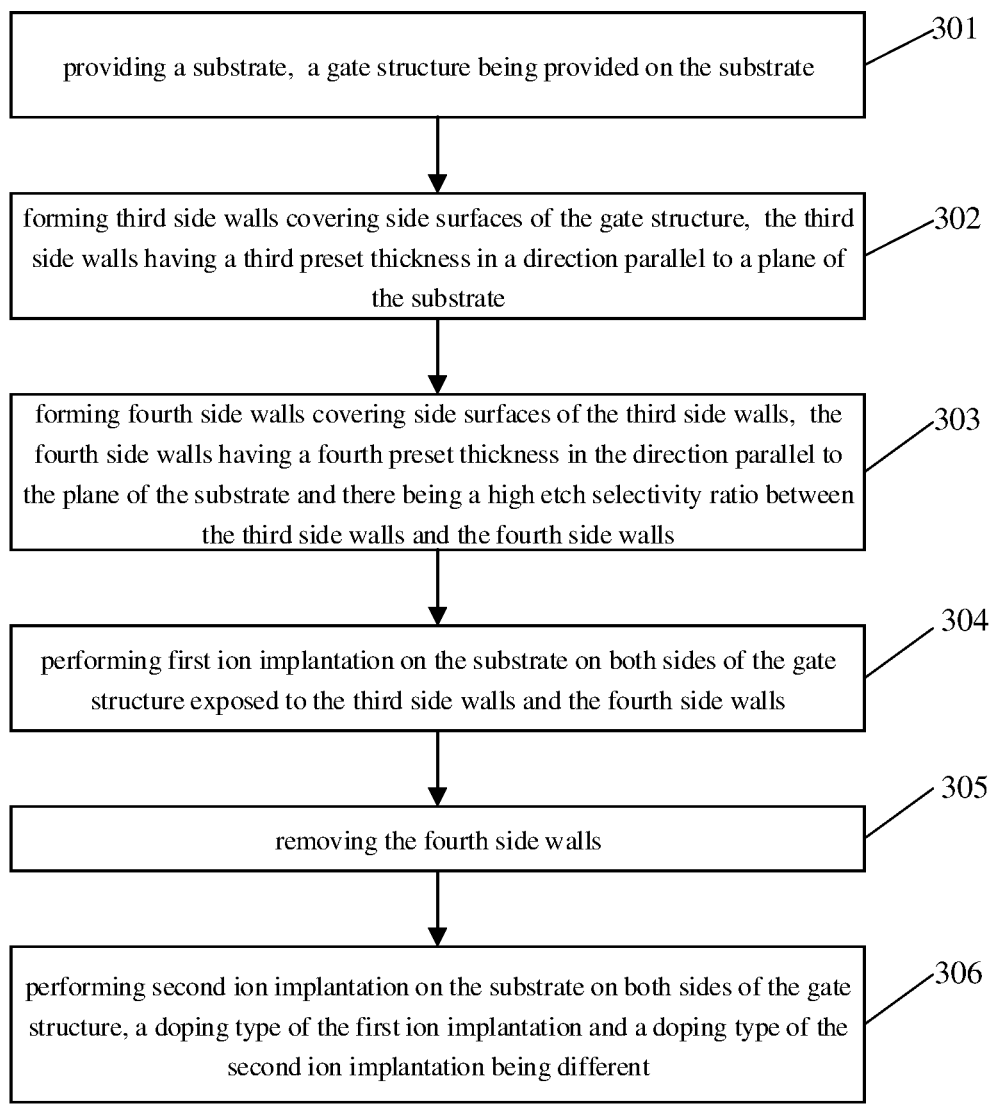
FIG. 3 is a schematic flowchart of a method for forming a semiconductor structure according to another embodiment of the disclosure.

The embodiments of the disclosure further provide a method for forming a semiconductor structure. Referring to FIG. 3 for details. As shown in FIG. 3, the method includes the following operations.

In operation 301, a substrate is provided, in which a gate structure is formed on the substrate.

In operation 302, third side walls covering side surfaces of the gate structure is formed, in which the third side walls have a third preset thickness in a direction parallel to a plane of the substrate.

In operation 303, fourth side walls covering side surfaces of the third side walls are formed, in which the fourth side walls have a fourth preset thickness in the direction parallel to the plane of the substrate, and there is a high etch selectivity ratio between the third side walls and the fourth side walls.

In operation 304, first ion implantation is performed on the substrate on both sides of the gate structure exposed to the third side walls and the fourth side walls.

In operation 305, the fourth side walls are removed.

In operation 306, second ion implantation is performed on the substrate on both sides of the gate structure, in which a doping type of the first ion implantation and a doping type of the second ion implantation are different.

The method for forming the semiconductor structure according to the embodiments of the disclosure will be further described in detail below in combination with specific embodiments.

FIGS. 4A to 4H are schematic structural diagrams of a process for forming a semiconductor structure according to embodiments of the disclosure.

Figure 4A:
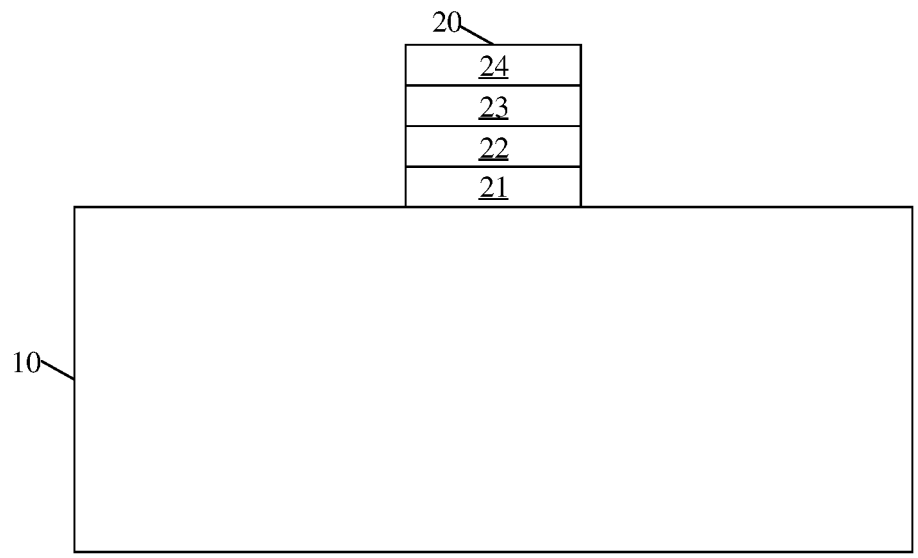
FIG. 4A is a first schematic structural diagram of a process for forming a semiconductor structure according to embodiments of the disclosure.

First, referring to FIG. 4A, operation 301 is executed: providing a substrate 10, in which a gate structure 20 is formed on the substrate 10.

The substrate 10 may be an elemental semiconductor material substrate (e.g., a silicon (Si) substrate, a germanium (Ge) substrate, etc.), a composite semiconductor material substrate (e.g., a silicon germanium (SiGe) substrate, etc.), a silicon-on-insulator (SOI) substrate, or a germanium-on-insulator (GeOI) substrate, etc.

The gate structure 20 sequentially includes a gate oxide layer 21, a first gate conductive layer 22, a second gate conductive layer 23, and a gate insulating layer 24 from bottom to top.

The material of the gate oxide layer 21 includes, but is not limited to, silicon oxide; the material of the first gate conductive layer 22 includes, but is not limited to, titanium nitride; the material of the second gate conductive layer 23 includes, but is not limited to, tungsten; and the material of the gate insulating layer 24 includes, but is not limited to, silicon nitride.

Figure 4B:
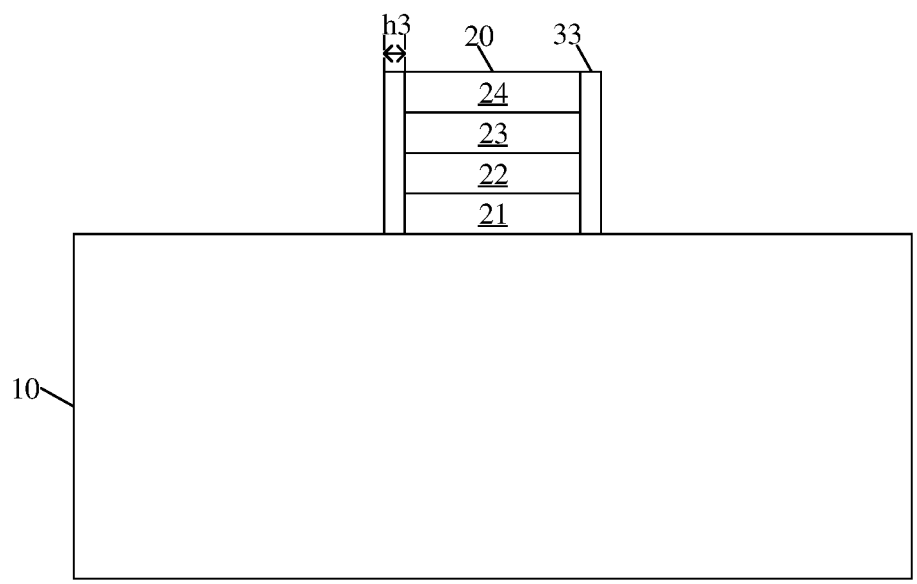
FIG. 4B is a second schematic structural diagram of a process for forming a semiconductor structure according to embodiments of the disclosure.

Next, referring FIG. 4B, operation 302 is executed: forming a third side walls 33 covering side surfaces of the gate structure 20, in which the third side walls 33 has a third preset thickness in a direction parallel to a plane of the substrate 10.

The third side walls 33 may be formed of silicon nitride, silicon oxide, silicon oxynitride, silicon carbide, fluoride-doped silicon glass, a low-k dielectric material, and a combination thereof, and/or other suitable materials.

The third preset thickness is h3 shown in FIG. 4B. In an embodiment, the range of the third preset thickness is 1-5 µm.

Figure 4C:
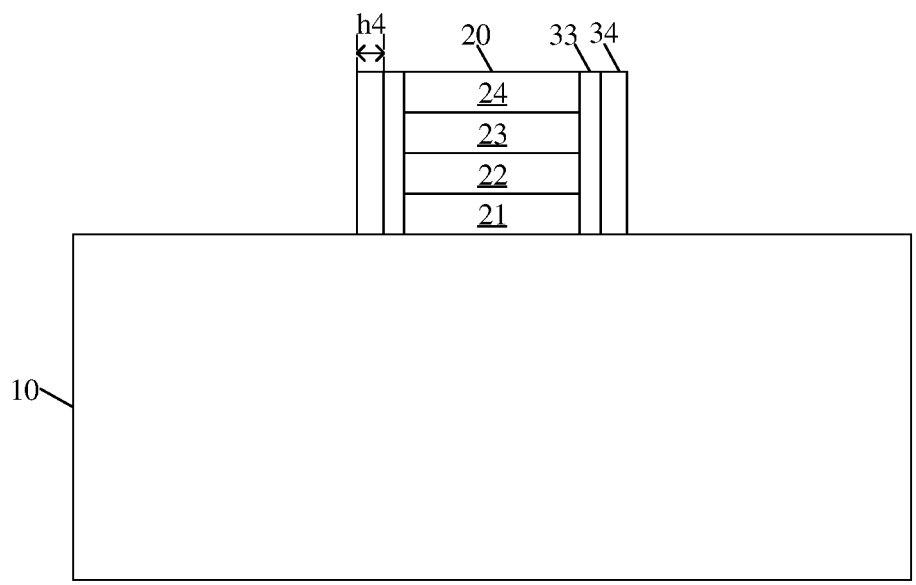
FIG. 4C is a third schematic structural diagram of a process for forming a semiconductor structure according to embodiments of the disclosure.

Next, referring to FIG. 4C, operation 303 is executed: forming fourth side walls 34 covering side surfaces of the third side walls 33, in which the fourth side walls 34 have a fourth preset thickness in the direction parallel to the plane of the substrate 10, and there is a high etch selectivity ratio between the third side walls 33 and the fourth side walls 34.

The fourth side walls 34 may be formed of silicon nitride, silicon oxide, silicon oxynitride, silicon carbide, fluoride-doped silicon glass, a low-k dielectric material, and a combination thereof, and/or other suitable materials.

The fourth preset thickness is h4 shown in FIG. 4C. In an embodiment, the fourth preset thickness is 4-5 µm.

In the embodiments of the disclosure, by setting a high etch selectivity ratio between the third side wall 33 and the fourth side wall 34, the fourth side wall as the outer layer may be selectively etched away. Compared with use of the same material, the solution is easier to control the etching degree, and the process difficulty is reduced.

Figure 4D:
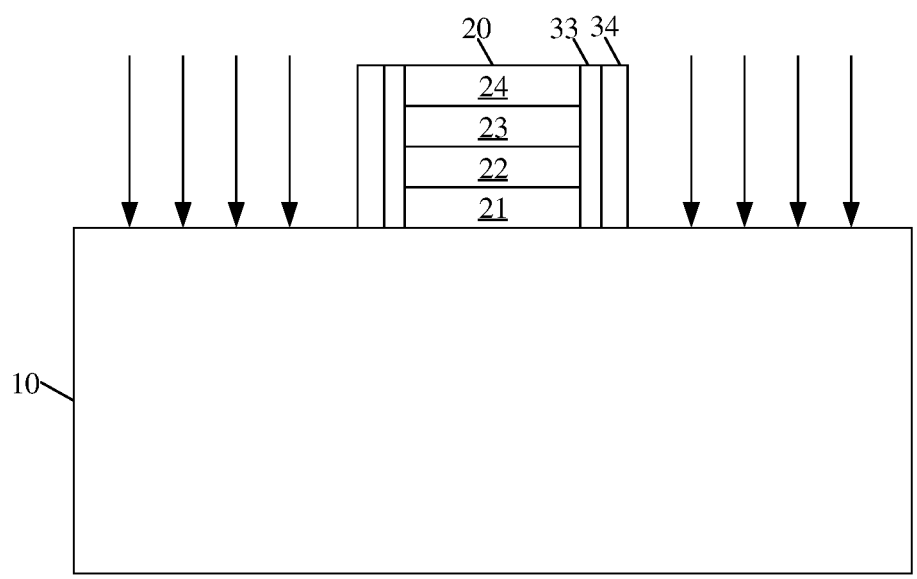
FIG. 4D is a fourth schematic structural diagram of a process for forming a semiconductor structure according to embodiments of the disclosure.

Next, referring to FIG. 4D, operation 304 is executed: performing first ion implantation on the substrate 10 on both sides of the gate structure 20 exposed to the third side walls 33 and the fourth side walls 34.

In an embodiment, the first ion implantation is LDD ion implantation.

After the first ion implantation, LDD ion implantation areas 410 are formed in the substrate 10 on both sides of the gate structure 20.

Figure 4E:
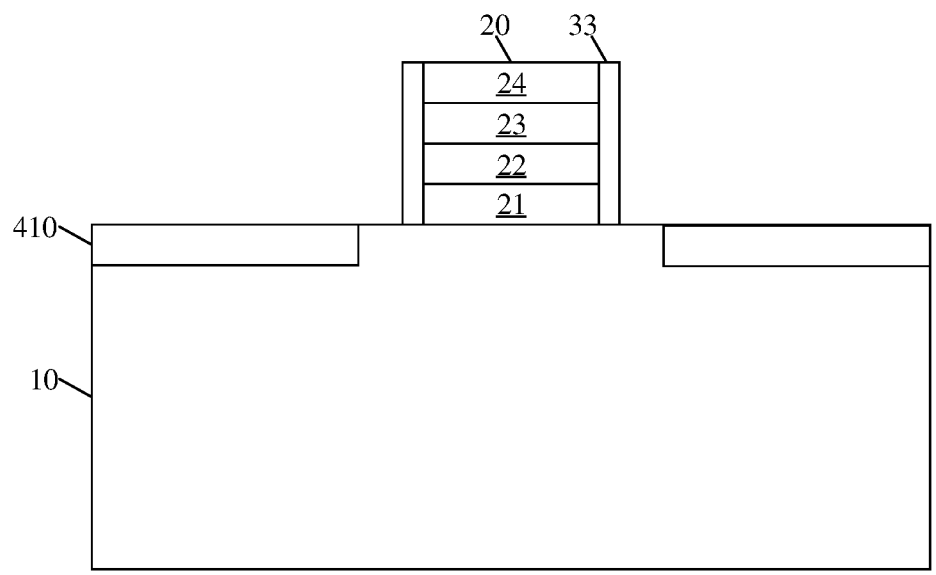
FIG. 4E is a fifth schematic structural diagram of a process for forming a semiconductor structure according to embodiments of the disclosure.

Next, referring to FIG. 4E, operation 305 is executed: removing the fourth side walls 34.

Figure 4F:
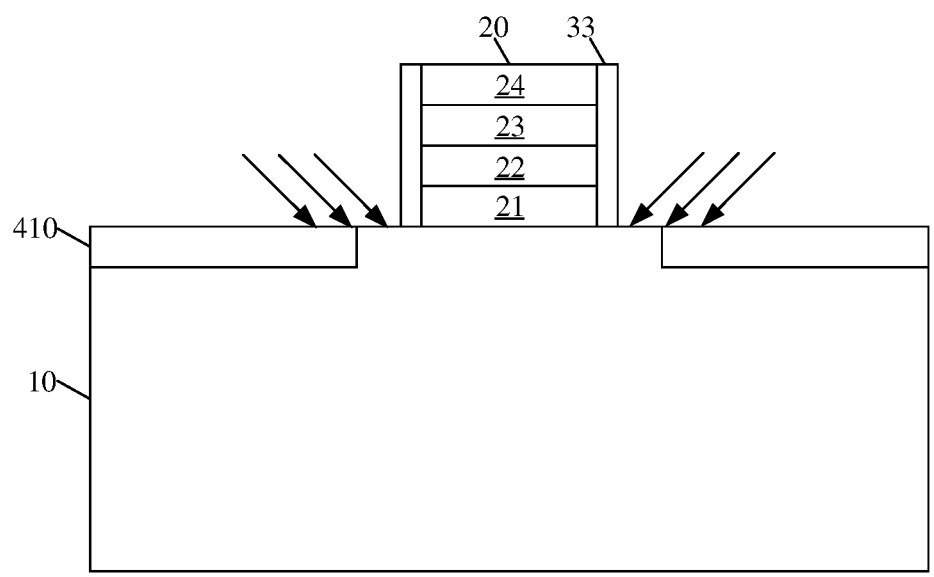
FIG. 4F is a sixth schematic structural diagram of a process for forming a semiconductor structure according to embodiments of the disclosure.

Next, referring to FIG. 4F, operation 306 is executed: performing second ion implantation on the substrate 10 on both sides of the gate structure 20, in which doping types of the first ion implantation and the second ion implantation are different.

In an embodiment, the second ion implantation is Halo ion implantation.

The doping types of the first ion implantation and the second ion implantation are different, that is, the doping types of the LDD ion implantation and the Halo ion implantation are different. Specifically, by taking an NMOS as an example, if the doping type of the LDD ion implantation is N type, then the doping type of the Halo ion implantation is P type.

In an embodiment, the first ion implantation is performed at a first preset included angle, which is between a direction of the first ion implantation and a direction perpendicular to the plane of the substrate 10; the second ion implantation is performed at a second preset included angle, which is an included angle between a direction of the second ion implantation and the direction perpendicular to the plane of the substrate 10; and the first preset included angle is less than the second preset included angle.

For the first ion implantation, that is, LDD ion implantation, vertical implantation or small-angle implantation is generally performed. The first preset included angle is 0°-3°.

For the second ion implantation, that is, Halo ion implantation, large-angle implantation is generally performed. The second preset included angle is 21°-30°.

The vertical implantation or small-angle implantation of LDD ions allows more LDD ions to be dispersed within the substrate on both sides of the gate structure, reducing diffusion of the LDD ions to the substrate under the gate structure, thereby reducing generation of GIDL current. The large-angle implantation of Halo ions may increase the Halo ions entering the substrate under the gate structure, thereby reducing diffusion of the LDD ions, and also reducing the SCE.

In an embodiment, the first ion implantation is performed at a first preset dose; the second ion implantation is performed at a second preset dose; and the first preset dose is greater than the second preset dose.

The first preset dose is $1\times10^{14}$ atoms/cm$^2$, and the second preset dose is $1\times10^{13}$ atoms/cm$^2$.

Figure 4G:
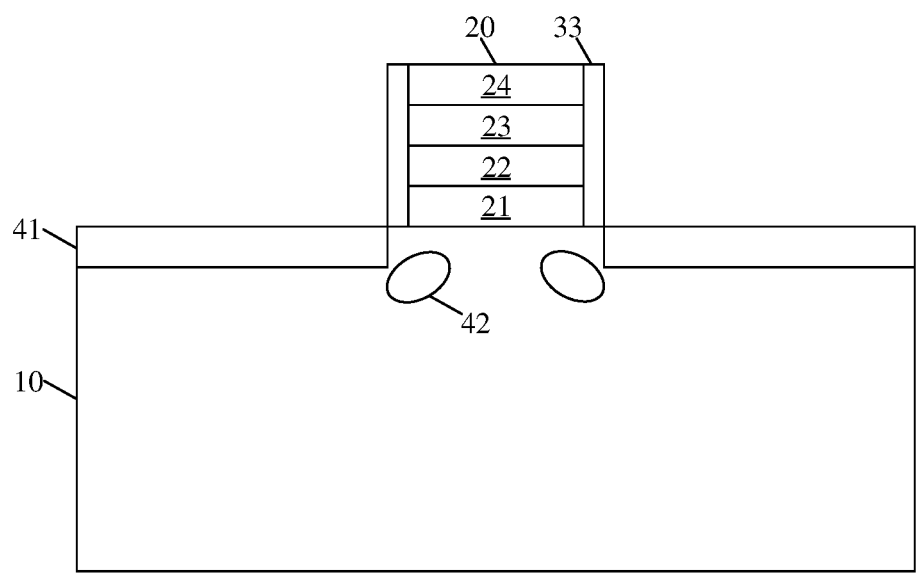
FIG. 4G is a seventh schematic structural diagram of a process for forming a semiconductor structure according to embodiments of the disclosure.

Next, referring to FIG. 4G, after performing the second ion implantation, thermal diffusion is performed on the substrate 10 on both sides of the gate structure 20 to form LDD areas 41 and Halo areas 42 in the substrate, in which in a direction perpendicular to the plane of the substrate 10, projections of the LDD areas 41 does not overlap a projection of the gate structure 20.

In some embodiments, the cases that projections of the LDD areas 41 do not overlap the projection of the gate structure 20 includes: a side surface of the LDD area 41 is flush with a side surface of the gate structure 20.

In this embodiment, since the third side walls and the fourth side walls have a large preset thickness, when the third side walls and the fourth side walls are taken as a mask to perform LDD ion implantation, diffusion of implanted ions to a channel can be effectively reduced. Therefore, projections of the LDD areas do not overlap the projection of the gate structure.

The LDD ion implantation areas 410 are subjected to thermal diffusion to form the LDD areas 41.

Figure 4H:
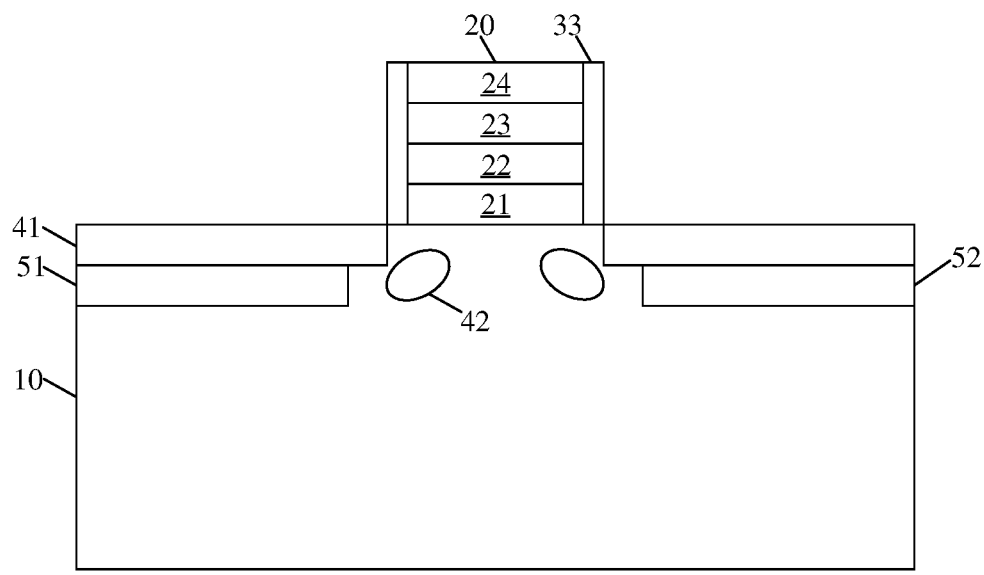
FIG. 4H is an eighth schematic structural diagram of a process for forming a semiconductor structure according to embodiments of the disclosure.

Next, referring to FIG. 4H, after forming the LDD areas 41 and the Halo areas 42, the method further includes: by taking the second side walls 33 as a mask, performing source-drain ion implantation on the substrate 10 on both sides of the gate structure 20 to form a source area 51 and a drain area 52.

The doping type of the source-drain ion implantation is the same as the doping type of the LDD ion implantation, and is different from the doping type of the Halo ion implantation. Specifically, if the doping type of the LDD ion implantation is P type, then the doping type of the Halo ion implantation is N type, and the doping type of the source-drain ion implantation is P type.

Figure 5:
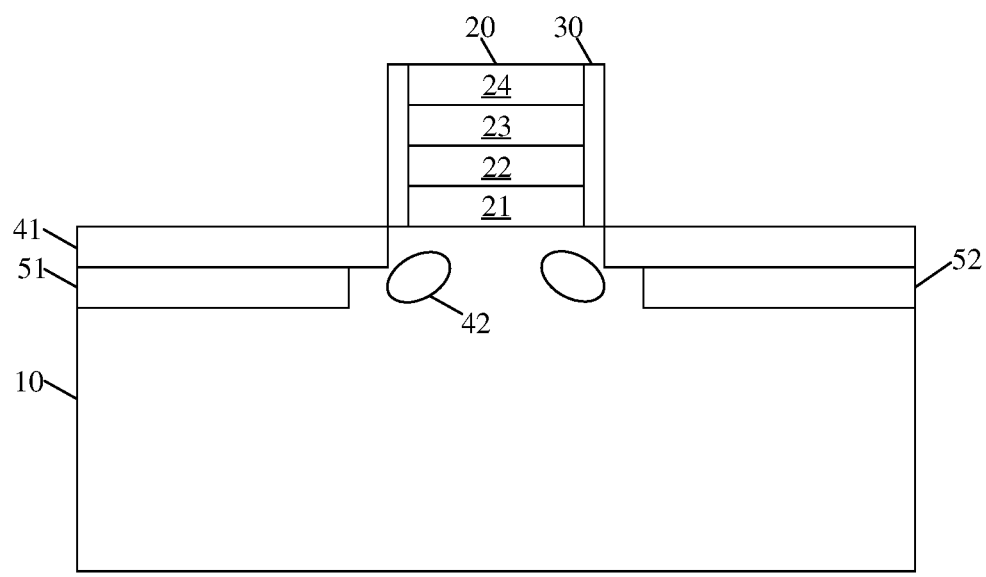
FIG. 5 is a schematic structural diagram of a semiconductor structure according to an embodiment of the disclosure.

The embodiments of the disclosure further provide a semiconductor structure. FIG. 5 is a schematic structural diagram of a semiconductor structure according to an embodiment of the disclosure.

As shown in FIG. 5, the semiconductor structure includes: a substrate 10; a gate structure 20, located on the substrate 10, in which side walls 30 are formed on side surfaces of the gate structure 20; and LDD areas 41 and Halo areas 42, located in the substrate 10, in which in a direction perpendicular to a plane of the substrate 10, projections of the LDD areas 41 does not overlap a projection of the gate structure 20, and projections of the Halo areas 42 and the projection of the gate structure 20 have overlapping portions.

The substrate 10 may be an elemental semiconductor material substrate (e.g., a silicon (Si) substrate, a germanium (Ge) substrate, etc.), a composite semiconductor material substrate (e.g., a silicon germanium (SiGe) substrate, etc.), a silicon-on-insulator (SOI) substrate, or a germanium-on-insulator (GeOI) substrate, etc.

The gate structure 20 sequentially includes a gate oxide layer 21, a first gate conductive layer 22, a second gate conductive layer 23, and a gate insulating layer 24 from bottom to top.

The material of the gate oxide layer 21 includes, but is not limited to, silicon oxide; the material of the first gate conductive layer 22 includes, but is not limited to, titanium nitride; the material of the second gate conductive layer 23 includes, but is not limited to, tungsten; and the material of the gate insulating layer 24 includes, but is not limited to, silicon nitride.

The side walls 30 may be formed of silicon nitride, silicon oxide, silicon oxynitride, silicon carbide, fluoride-doped silicon glass, a low-k dielectric material, and a combination thereof, and/or other suitable materials.

In some embodiments, the side walls 30 have a preset thickness of 1-5 μm.

In some embodiments, the cases that the projections of the LDD areas 41 do not overlap the projection of the gate structure 20 includes: side surfaces of the LDD areas 41 are flush with a side surface of the gate structure 20.

In some embodiments, the doping types of the LDD area 41 and the Halo area 42 are different. Specifically, by taking an NMOS as an example, if the doping type of the LDD area is N type, then the doping type of the Halo area is P type.

The dose of ion implantation in the LDD area 41 is $1\times10^{14}$ atoms/cm$^2$, and the dose of ion implantation in the Halo area 42 is $1\times10^{13}$ atoms/cm$^2$.

In an embodiment, the semiconductor structure further includes: a source area 51 and a drain area 52, in which the source area 51 and the drain area 52 are respectively located in the substrate 10 on both sides of the gate structure 20.

The doping types of the source area 51 and the drain area 52 are the same as the doping type of the LDD areas, and are different from the doping type of the Halo areas. Specifically, if the doping type of the LDD areas is P type, then the doping type of the Halo areas is N type, and the doping type of the source area 51 and the drain area 52 is P type.

The foregoing descriptions are merely preferred embodiments of the disclosure, and are not intended to limit the scope of protection of the disclosure. Any modification, equivalent replacement, improvement and the like made within the spirit and principle of the disclosure shall fall within the scope of protection of the disclosure.

In the embodiments of the disclosure, the first side walls with a larger thickness is first formed, and the first side walls are taken as the mask to perform first ion implantation, that is, LDD ion implantation, which can effectively reduce diffusion of implanted ions to the channel, thereby reducing generation of GIDL current. Then, a part of the first side walls are etched away to form the second side walls with a smaller thickness, and second ion implantation is performed, that is, Halo ion implantation, so that Halo ions implanted under the channel increase, and the SCE can be reduced. Moreover, when the Halo ion implantation is performed, the second side walls as the mask have a smaller thickness, and the Halo ions implanted under the channel increase, so that the dose of ions reaching the same threshold voltage correspondingly decreases, thereby reducing generation of junction leakage.

What is claimed is:

1. A method for forming a semiconductor structure, comprising:

providing a substrate, wherein a gate structure is formed on the substrate;

forming first side walls covering side surfaces of the gate structure, wherein the first side walls have a first preset thickness in a direction parallel to a plane of the substrate;

performing first ion implantation on the substrate on both sides of the gate structure exposed to the first side walls;

removing a part of the first side walls to form second side walls, wherein the second side walls have a second preset thickness in the direction parallel to the plane of the substrate;

performing second ion implantation on the substrate on both sides of the gate structure, wherein a doping type of the first ion implantation and a doping type of the second ion implantation are different;

wherein the first ion implantation is LDD ion implantation; and the second ion implantation is Halo ion implantation; and after performing the second ion implantation, performing thermal diffusion on the substrate on both sides of the gate structure to form LDD areas and Halo areas in the substrate, wherein in a direction perpendicular to the plane of the substrate, projections of the LDD areas and a projection of the gate structure do not overlap.

2. The method of claim 1, wherein, the first preset thickness is 5-10 μm, and the second preset thickness is 1-5 μm.

3. The method of claim 1, wherein,
the first ion implantation is performed at a first preset included angle, wherein the first preset included angle is between a direction of the first ion implantation and a direction perpendicular to the plane of the substrate;
the second ion implantation is performed at a second preset included angle, wherein the second preset included angle is between a direction of the second ion implantation and the direction perpendicular to the plane of the substrate;
wherein the first preset included angle is less than the second preset included angle.

4. The method of claim 1, wherein,
the first ion implantation is performed at a first preset dose;
the second ion implantation is performed at a second preset dose;
wherein the first preset dose is greater than the second preset dose.

5. The method of claim 1, wherein
after forming the LDD areas and the Halo areas, the method further comprises:
by taking the second side walls as a mask, performing source-drain ion implantation on the substrate on both sides of the gate structure to form a source area and a drain area.

6. A method for forming a semiconductor structure, comprising:
providing a substrate, wherein a gate structure is provided on the substrate;

forming third side walls covering side surfaces of the gate structure, in which the third side walls have a third preset thickness in a direction parallel to a plane of the substrate;

forming fourth side walls covering side surfaces of the third side walls, in which the fourth side walls have a fourth preset thickness in the direction parallel to the plane of the substrate, and there is a high etch selectivity ratio between the third side walls and the fourth side walls;

performing first ion implantation on the substrate on both sides of the gate structure exposed to the third side walls and the fourth side walls;

removing the fourth side walls; and performing second ion implantation on the substrate on both sides of the gate structure, wherein a doping type of the first ion implantation and a doping type of the second ion implantation are different.

7. The method of claim 6, wherein
the third preset thickness is 1-5 μm, and the fourth preset thickness is 4-5 μm.

8. The method of claim 6, wherein,
the first ion implantation is LDD ion implantation; and the second ion implantation is Halo ion implantation.

9. The method of claim 8, wherein,
the first ion implantation is performed at a first preset included angle, wherein the first preset included angle is between a direction of the first ion implantation and a direction perpendicular to the plane of the substrate;
the second ion implantation is performed at second preset included angle, wherein the second preset included angle is between a direction of the second ion implantation and the direction perpendicular to the plane of the substrate;
wherein the first preset included angle is less than the second preset included angle.

10. The method of claim 8, wherein,
the first ion implantation is performed at a first preset dose;
the second ion implantation is performed at a second preset dose;
wherein the first preset dose is greater than the second preset dose.

11. The method of claim 8, further comprising:
after performing the second ion implantation, performing thermal diffusion on the substrate on both sides of the gate structure to form LDD areas and Halo areas in the substrate, wherein in a direction perpendicular to the plane of the substrate, projections of the LDD areas and a projection of the gate structure do not overlap.

12. The method of claim 11, wherein after forming the LDD areas and the Halo areas, the method further comprises:
by taking the third side walls as a mask, performing source-drain ion implantation on the substrate on both sides of the gate structure to form a source area and a drain area.

* * * * *